(12) United States Patent
Matsudaira et al.

(10) Patent No.: US 12,311,557 B2
(45) Date of Patent: May 27, 2025

(54) CONTROLLER FOR ROBOT AND POWER-OUTAGE PROCESSING METHOD

(71) Applicant: FANUC CORPORATION, Yamanashi (JP)

(72) Inventors: Tetsuro Matsudaira, Yamanashi (JP); Yoshikiyo Tanabe, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 163 days.

(21) Appl. No.: 17/788,798

(22) PCT Filed: Jan. 18, 2021

(86) PCT No.: PCT/JP2021/001469
§ 371 (c)(1),
(2) Date: Jun. 24, 2022

(87) PCT Pub. No.: WO2021/149634
PCT Pub. Date: Jul. 29, 2021

(65) Prior Publication Data
US 2022/0355484 A1    Nov. 10, 2022

(30) Foreign Application Priority Data
Jan. 20, 2020 (JP) ................. 2020-006777

(51) Int. Cl.
*G01R 19/10* (2006.01)
*B25J 9/16* (2006.01)
(Continued)

(52) U.S. Cl.
CPC ...... *B25J 9/1674* (2013.01); *G01R 19/16576* (2013.01)

(58) Field of Classification Search
CPC ...... G01R 19/10; G01R 19/165; G01R 31/26; G01R 31/319; G01R 31/317; G01R 31/36; G05B 19/406
See application file for complete search history.

(56) References Cited

U.S. PATENT DOCUMENTS

| | | |
|---|---|---|
| 2013/0310974 A1 | 11/2013 | Iwata |
| 2018/0004186 A1 | 1/2018 | Tanaka |

(Continued)

FOREIGN PATENT DOCUMENTS

| | | |
|---|---|---|
| CN | 105313118 A | 2/2016 |
| CN | 107230968 A | 10/2017 |

(Continued)

OTHER PUBLICATIONS

International Search Report dated Mar. 30, 2021, for International Patent Application No. PCT/JP2021/001469.
(Continued)

*Primary Examiner* — Neel D Shah
(74) *Attorney, Agent, or Firm* — KARCESKI IP LAW, PLLC

(57) ABSTRACT

A controller of a robot includes: a voltage detecting portion that detects a power-source voltage input from a power source; and a determining portion that determines, on the basis of the power-source voltage detected by the voltage detecting portion, whether to perform power-outage processing that guarantees the operation, wherein the determining portion includes a first timer that starts a clock at a point in time when the detected power-source voltage becomes equal to or less than a first threshold voltage that guarantees the operation and makes a determination for performing the power-outage processing in the case in which the power-source voltage does not exceed the first threshold voltage before the time measured by the first timer achieves a prescribed time that is longer than one cycle of the power-source voltage.

8 Claims, 7 Drawing Sheets

(51) Int. Cl.
*G01R 19/165* (2006.01)
*G01R 31/26* (2020.01)
*G01R 31/317* (2006.01)
*G01R 31/319* (2006.01)
*G01R 31/36* (2020.01)
*G05B 19/406* (2006.01)

(56) References Cited

U.S. PATENT DOCUMENTS

| | | | | |
|---|---|---|---|---|
| 2021/0013815 A1* | 1/2021 | Kuboyama | ............... | H02J 3/34 |
| 2021/0028707 A1* | 1/2021 | Ogaki | ..................... | G06F 1/305 |
| 2021/0313893 A1* | 10/2021 | Nomura | ................ | H03K 17/18 |

FOREIGN PATENT DOCUMENTS

| | | | |
|---|---|---|---|
| CN | 109870650 A | | 6/2019 |
| JP | H07306230 A | | 11/1995 |
| JP | H1051954 A | | 2/1998 |
| JP | H1151985 A | | 2/1999 |
| JP | 2003005872 A | | 1/2003 |
| JP | 2004220384 A | | 8/2004 |
| JP | 2007322192 A | | 12/2007 |
| JP | 2012157958 A | | 8/2012 |
| JP | 2013178186 A | | 9/2013 |
| JP | 2017226010 | * | 12/2017 |
| JP | 2018005489 A | | 1/2018 |

OTHER PUBLICATIONS

Chinese Office Action dated Jan. 14, 2025, for Chinese Patent Application No. 202180009304.2.

* cited by examiner

CONTROLLER FOR ROBOT AND POWER-OUTAGE PROCESSING METHOD

CROSS-REFERENCE TO RELATED APPLICATION(S)

This is a National Stage Entry into the United States Patent and Trademark Office from International Patent Application No. PCT/JP2021/001469, filed on Jan. 18, 2021, which claims priority to Japanese Patent Application No. 2020-006777, filed on Jan. 20, 2020, the entire contents of both of which are incorporated herein by reference.

FIELD OF THE INVENTION

The present disclosure relates to a controller for a robot and a power-outage processing method.

BACKGROUND OF THE INVENTION

There is a known power-outage detection method in which the voltage supplied to a microcomputer of electronic equipment is monitored and, it is determined whether the voltage has dropped to or below the guaranteed operating voltage of the microcomputer (for example, see Japanese Unexamined Patent Application, Publication No. H10-51954). Also, in the case in which the voltage has dropped to or below the guaranteed operating voltage, control performed by the microcomputer with respect to peripheral equipment is stopped.

SUMMARY OF THE INVENTION

An aspect of the present disclosure is a controller for a robot, the controller including: a voltage detecting portion that detects a power-source voltage input from a power source; and a determining portion that determines, on a basis of the power-source voltage detected by the voltage detecting portion, whether to perform power-outage processing that guarantees an operation, wherein the determining portion comprises a first timer that starts a clock at a point in time when the detected power-source voltage become equal to or less than a first threshold voltage that guarantees the operation and makes a determination for performing power-outage processing in a case in which the power-source voltage does not exceed the first threshold voltage before the time measured by the first timer achieves a prescribed time that is longer than one cycle of the power-source voltage.

DESCRIPTION OF EMBODIMENT(S) OF THE INVENTION

A controller 1 of a robot 200 and a power-outage processing method according to an embodiment of the present disclosure will be described below with reference to the drawings.

Figure 1:
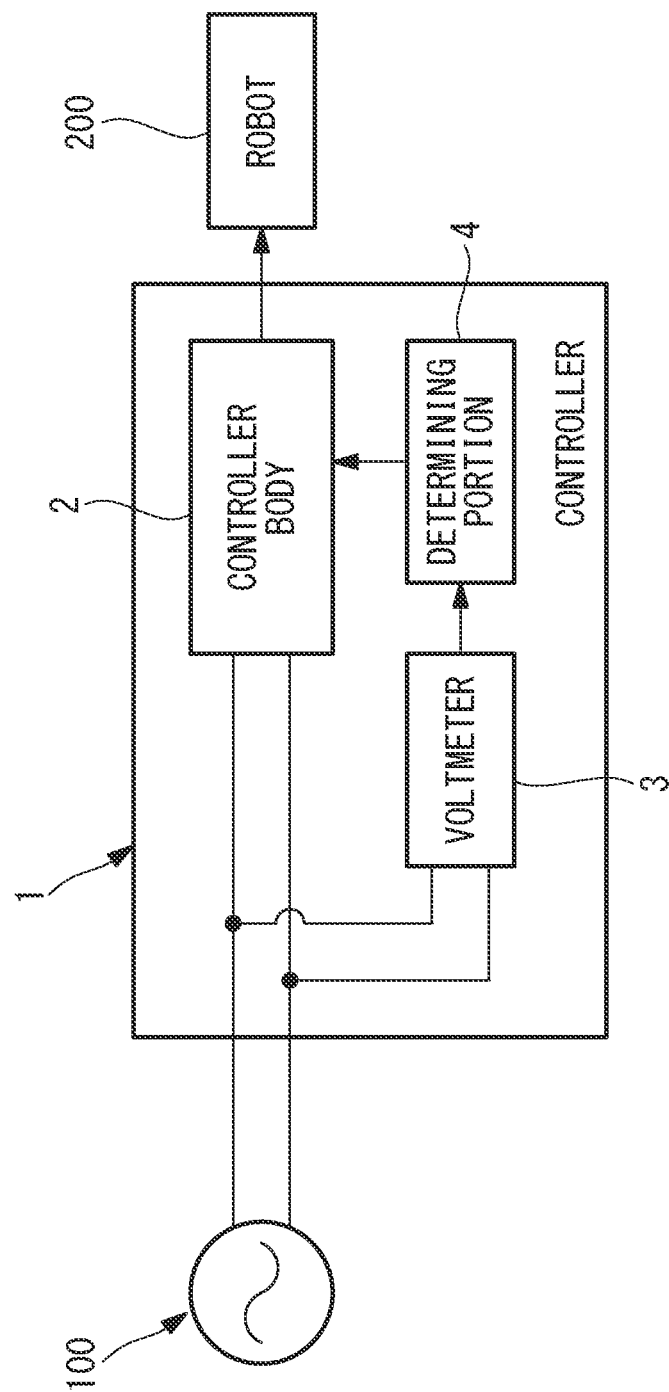
FIG. 1 is a block diagram showing a controller for a robot, according to an embodiment of the present disclosure.

Regarding the controller 1 of the robot 200 according to this embodiment, as shown in FIG. 1, the controller 1 is operated by means of a power-source voltage input from a power source 100 and includes: a controller body 2 that controls the robot 200; a voltmeter (voltage detecting portion) 3 that measures the power-source voltage; and a determining portion 4 that determines, on the basis of the power-source voltage measured by the voltmeter 3, whether to perform power-outage processing.

Figure 2:
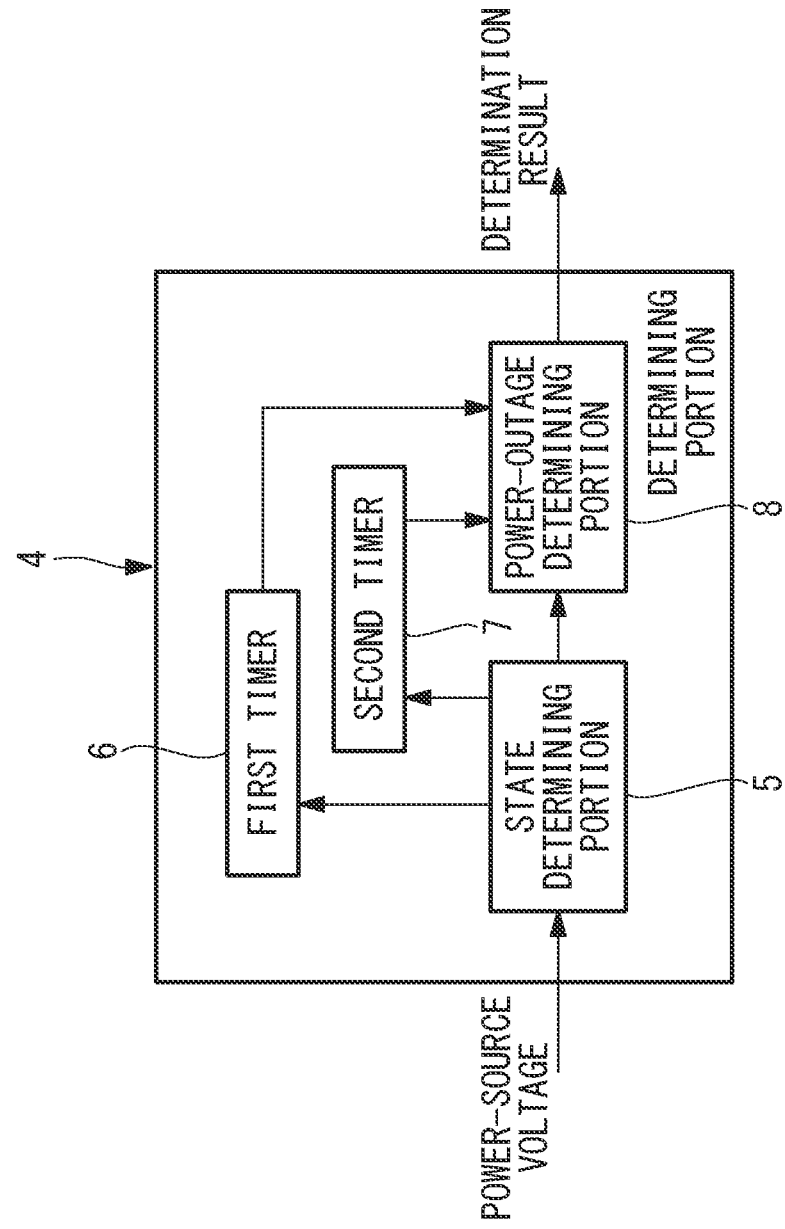
FIG. 2 is a block diagram showing a determining portion provided in the controller in FIG. 1.

As shown in FIG. 2, the determining portion 4 includes a state determining portion 5 that monitors a power-source voltage detected by the voltmeter 3 and determines the state of the power-source voltage. The state determining portion 5 is constituted of a processor and a memory and stores a first threshold voltage Th1 and a second threshold voltage Th2, which is lower than the first threshold voltage Th1. As the first threshold voltage Th1, a guaranteed operating voltage at which the operation of the controller 1 is guaranteed is employed.

The guaranteed operating voltage is a voltage required to perform the power-outage processing. The power-source voltage is stored by a capacitor (not shown), and the power stored in the capacitor is utilized in the power-outage processing performed when the power source 100 is shut off.

Figure 3:
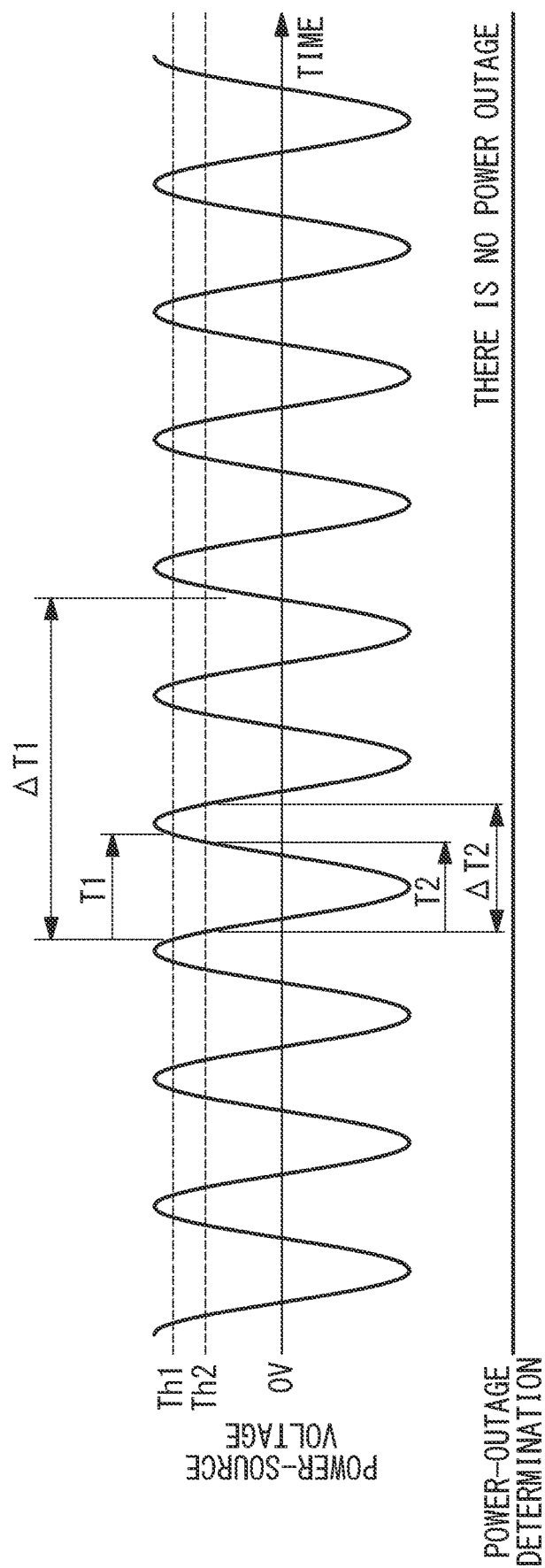
FIG. 3 is a diagram showing a waveform of a normal power-source voltage supplied to the controller in FIG. 1 and a power-outage determination result.
Figure 4:
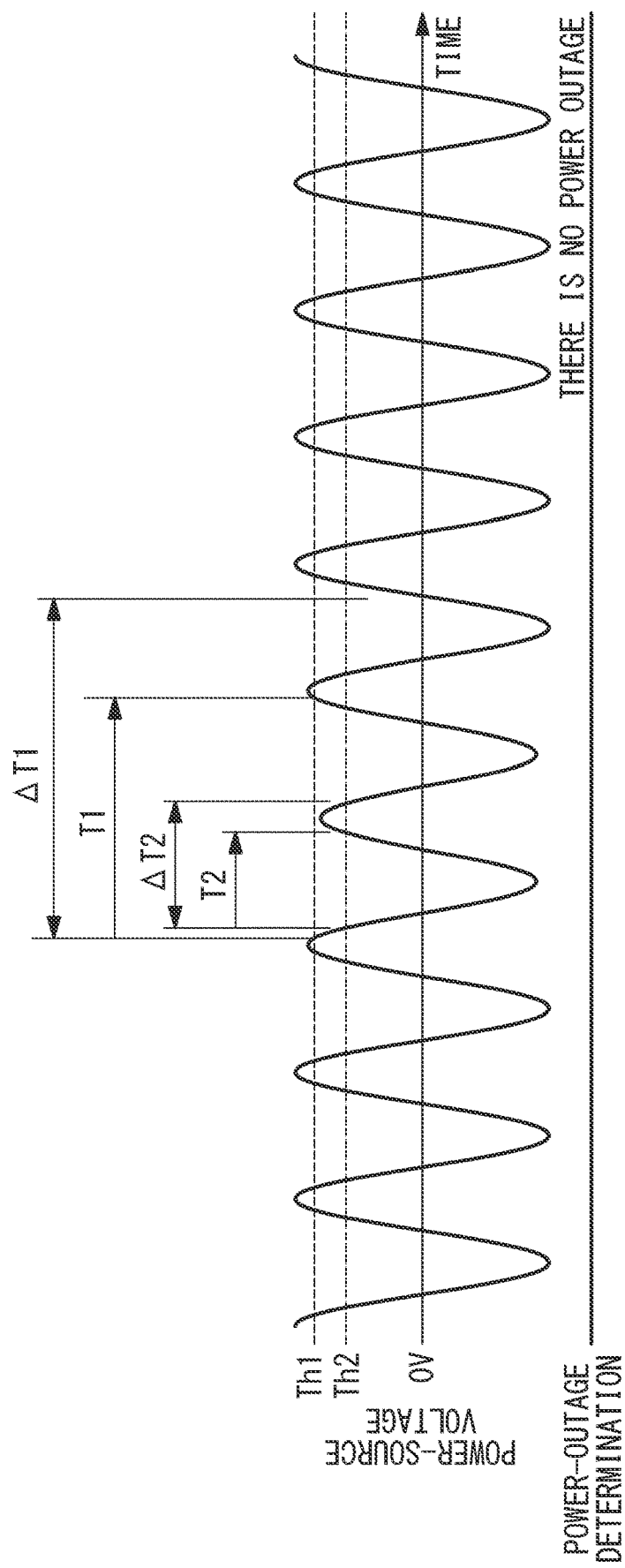
FIG. 4 is a diagram showing a waveform of the power-source voltage and a power-outage determination result for the case in which the power-source voltage supplied to the controller in FIG. 1 has dropped for a short period of time.

As shown in FIG. 3, although the power-source voltage changes in a cycle in accordance with a power-source frequency, the power required to perform the power-outage processing is sufficiently ensured so long as a peak value is above the first threshold voltage Th1. In addition, as shown in FIG. 4, even if the peak value of the power-source voltage becomes equal to or less than the first threshold voltage Th1, the power required to perform the power-outage processing is sufficiently ensured so long as the period of such a time is shorter than a prescribed time ΔT1.

Here, the prescribed time ΔT1 is set to, for example, a value greater than an acceleration period of the robot 200 during which power greater than a certain amount of power is required. Alternatively, in the case in which the robot 200 is installed in a region with an unstable power-source situation, for so-called momentary power outages, in which a power-source voltage temporarily drops due to fluctuations in the power source 100, an average time thereof (average momentary power outage time) may be measured in advance. Then, a value greater than the average momentary power outage time may be employed as the prescribed time ΔT1.

The state determining portion 5 compares a power-source voltage V detected by the voltmeter with the stored first threshold voltage Th1 and second threshold voltage Th2. The state determining portion 5 outputs a signal indicating a first state in the case in which the power-source voltage V is above the first threshold voltage Th1.

In addition, the state determining portion 5 outputs a signal indicating a second state in the case in which the power-source voltage V exceeds the second threshold voltage Th2 and is equal to or less than the first threshold voltage Th1. Furthermore, the state determining portion 5 outputs a signal indicating a third state in the case in which the power-source voltage V is equal to or less than the second threshold voltage Th2.

The determining portion 4 includes a first timer 6 and a second timer 7 that measure time on the basis of the signals from the state determining portion 5. The first timer 6 starts to measure a time T1 at a point in time when the state-indicating signal from the state determining portion 5 changes to the signal for the second state from the signal for the first state, in other words, at a point in time when the power-source voltage V becomes equal to or less than the first threshold voltage Th1. In addition, the first timer 6 is reset at a point in time when the state-indicating signal from the state determining portion changes to the signal for the first state from the signal for the second state, in other words, at a point in time when the power-source voltage V exceeds the first threshold voltage Th1.

The second timer 7 starts to measure a time T2 at a point in time when the state-indicating signal from the state determining portion 5 changes to the signal for the third state from that for the second state, in other words, at a point in time when the power-source voltage V becomes equal to or less than the second threshold voltage Th2. In addition, the second timer 7 is reset at a point in time when the state-indicating signal from the state determining portion 5 changes to the signal for the second state from that for the third state, in other words, at a point in time when the power-source voltage V exceeds the second threshold voltage Th2.

In addition, the determining portion 4 includes a power-outage determining portion 8 that is connected to the state determining portion 5, the first timer 6, and the second timer 7 and that determines whether to perform the power-outage processing.

The power-outage determining portion 8 is constituted of a processor and a memory and does not make a determination for performing the power-outage processing in the case in which the state of the power-source voltage V transmitted thereto from the state determining portion 5 is the first state. In addition, the power-outage determining portion 8 also does not make the determination for performing the power-outage processing in the case in which the state of the power-source voltage V is the second state and the time T1 transmitted thereto from the first timer 6 is equal to or less than the prescribed time ΔT1.

In contrast, the power-outage determining portion 8 makes the determination for performing the power-outage processing in the case in which the state of the power-source voltage V is the second state or the third state and the time T1 transmitted thereto from the first timer 6 exceeds the prescribed time ΔT1. In addition, the power-outage determining portion 8 also makes the determination for performing the power-outage processing in the case in which the state of the power-source voltage V is the third state and the time T2 transmitted thereto from the second timer 7 exceeds one cycle ΔT2 of the power-source voltage. The cycle ΔT2 is 20 ms in the case in which the power-source frequency is 50 Hz.

The result of the determination made by the power-outage determining portion 8 is transmitted to the controller body 2.

The controller body 2 performs the power-outage processing when the determination result for performing the power-outage processing is transmitted thereto from the power-outage determining portion 8.

Figure 5:
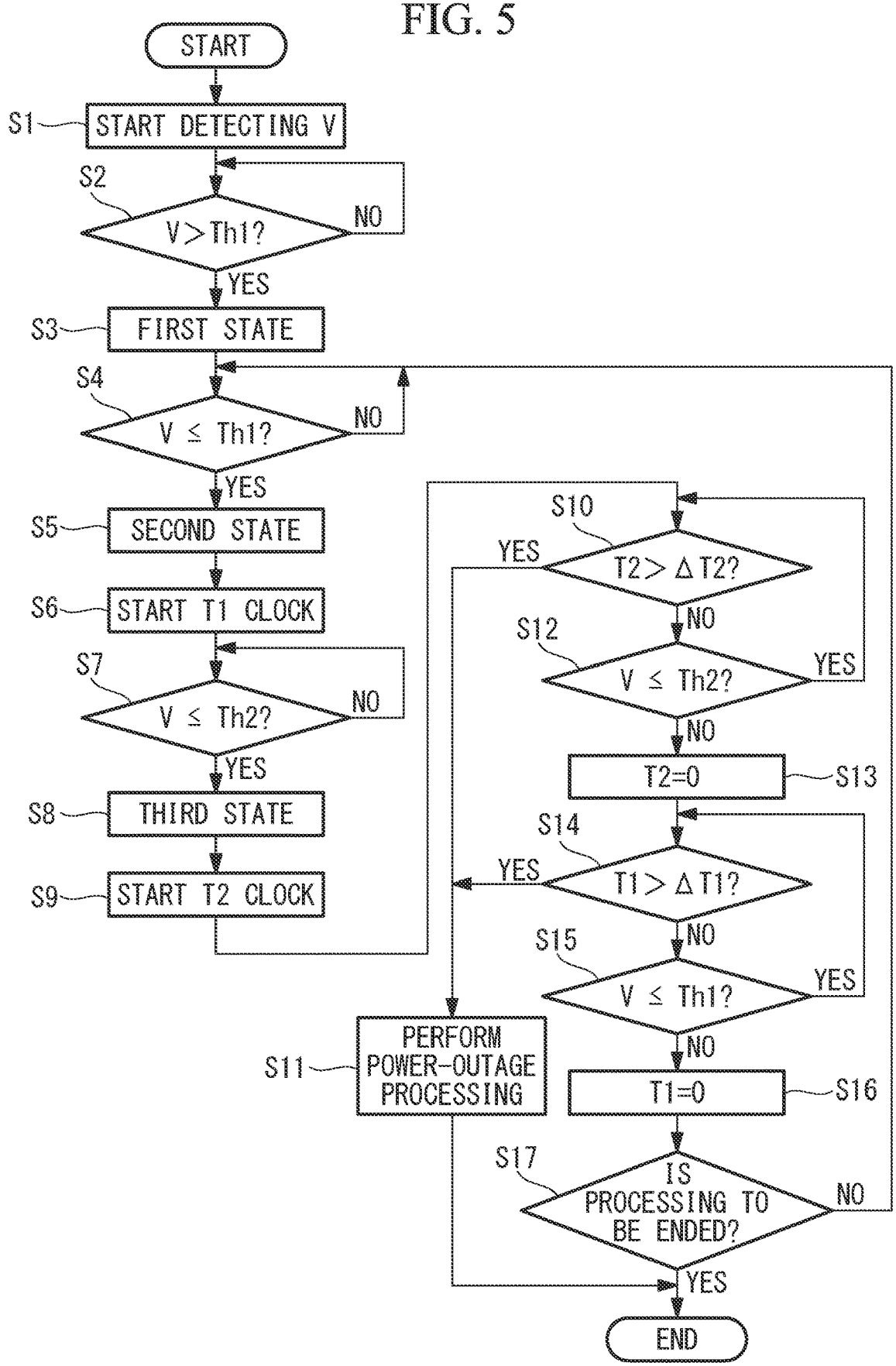
FIG. 5 is a flowchart showing a power-outage processing method according to an embodiment of the present disclosure, the method employing the controller in FIG. 1.

The power-outage processing method employing the thus-configured controller 1 of the robot 200, according to this embodiment, will be described below. As shown in FIG. 5, with the power-outage processing method according to this embodiment, the voltmeter starts to detect the power-source voltage V at a prescribed sampling interval (step S1), and the detected power-source voltage V is transmitted to the determining portion 4. The sampling interval is a time that is sufficiently shorter than the cycle of the power-source voltage V.

As shown in FIG. 3, in the individual cycles, the power-source voltage V moves through a negative peak value from a positive peak value and subsequently reach a positive peak value again.

The state determining portion 5 stands by, for example, until the power-source voltage V becomes greater than the first threshold voltage Th1 (step S2), and determines the state of being greater than the first threshold voltage Th1 as being in the first state (step S3). Next, the state determining portion 5 stands by until the power-source voltage V becomes equal to or less than the first threshold voltage Th1 (step S4), and determines the state of being equal to or less than the first threshold voltage Th1 as being in the second state (step S5).

As shown in FIG. 3, at the moment the power-source voltage V becomes the second state, the first timer 6 is turned on and starts to measure the time T1 (step S6).

Next, the state determining portion 5 stands by until the power-source voltage V becomes equal to or less than the second threshold voltage Th2 (step S7), and determines the state of being equal to or less than the second threshold voltage Th2 as being in the third state (step S8). Then, as shown in FIG. 3, at the moment the power-source voltage V becomes the third state, the second timer 7 is turned on and starts to measure the time T2 (step S9).

Figure 6:
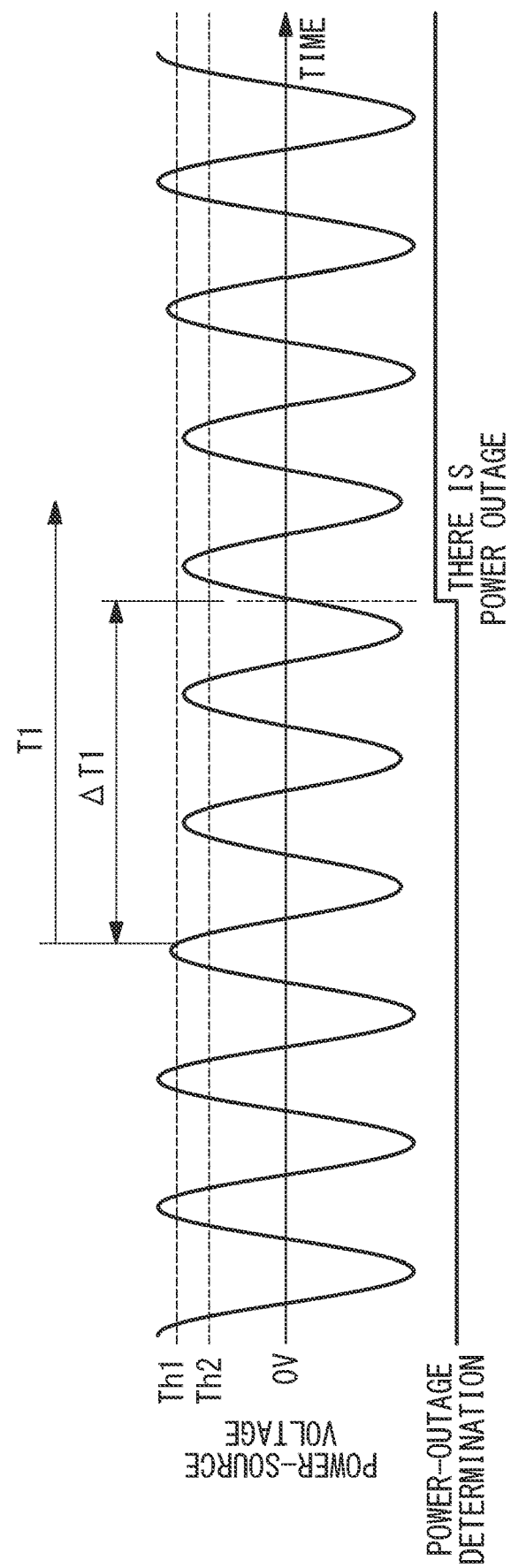
FIG. 6 is a diagram showing a waveform of the power-source voltage and a power-outage determination result for the case in which the power-source voltage supplied to the controller in FIG. 1 has remained below a first threshold voltage for a longer period of time than a prescribed time.

The determination results in the state determining portion 5 and the time values measured by the first timer 6 and the second timer 7 are sequentially transmitted to the power-outage determining portion 8. The power-outage determining portion 8 makes the determination for performing the power-outage processing when, as shown in FIG. 6, the time T1 measured by the first timer 6 exceeds the prescribed time ΔT1 while the state of the power-source voltage V is in the second state or the third state.

Specifically, in this case, it can be determined that it is not possible to ensure sufficient power for performing the power-outage processing, because a state in which the positive peak value of the power-source voltage V does not exceed the first threshold voltage Th1 has continued for the prescribed time ΔT1.

The second state is achieved when the power-source voltage V further drops over time, reaches a negative peak value, increases from the negative peak value, and exceeds the second threshold voltage Th2, and the power-source voltage V returns to the first state when the power-source voltage V further increases and exceeds the first threshold voltage Th1.

In the case in which power-source voltage V is normal, before the power-source voltage V returns to a positive peak value from a negative peak value, the power-source voltage V reaches the second state from the third state as a result of exceeding the second threshold voltage Th2, and further reaches the first state as a result of exceeding the first threshold voltage Th1.

Figure 7:
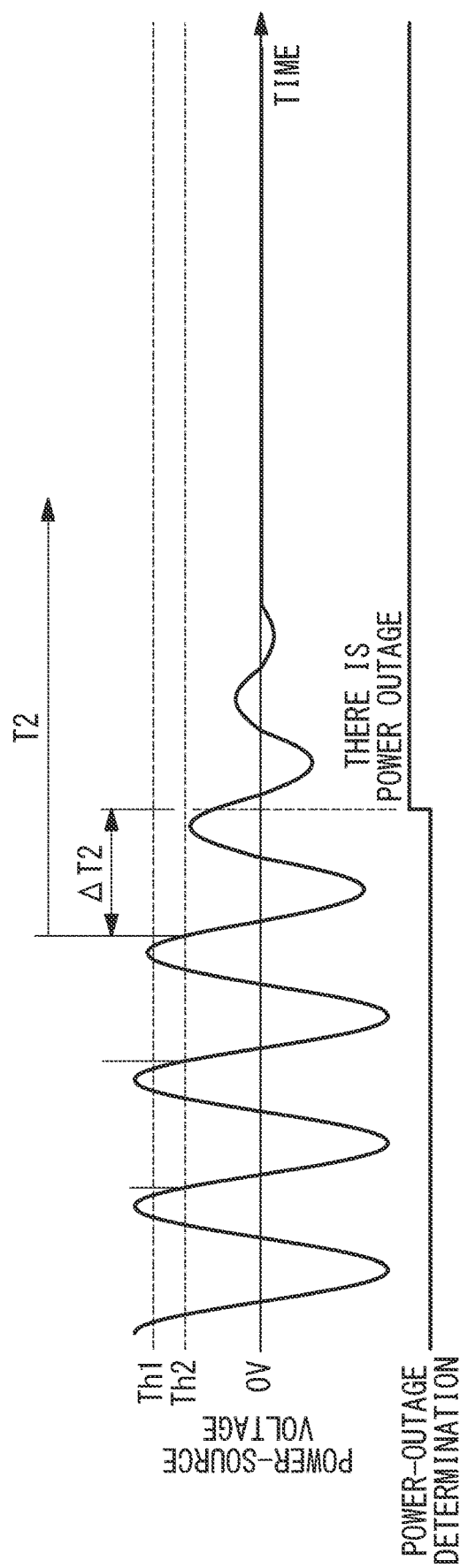
FIG. 7 is a diagram showing a waveform of the power-source voltage and a power-outage determination result for the case in which the power-source voltage supplied to the controller in FIG. 1 has remained below a second threshold voltage for a longer period of time than one cycle.

The power-outage determining portion 8 determines whether the time T2 during which the third state is achieved is longer than one cycle ΔT2 of the power-source voltage V (step S10), and makes the determination for performing the power-outage processing in the case in which the time T2 is longer than one cycle ΔT2, as shown in FIG. 7 (step S11).

In contrast, in the case in which the state of the power-source voltage V becomes the second state before the time T2 reaches one cycle ΔT2 of the power-source voltage V (step S12), the second timer 7 is reset at that moment (step S13). In this case, the determination for performing the power-outage processing is not made.

Subsequently, the power-outage determining portion 8 determines whether the time T1 during which the second state is achieved is longer than the prescribed time ΔT1 (step S14). In addition, in the case in which the state of the power-source voltage V is not the second state in step S12, the processing from step S10 is repeated.

As shown in FIG. 3, in the case in which the state of the power-source voltage V returns to the first state before the time T1 reaches the prescribed time ΔT1 (step S15), the first timer 6 is reset at that moment (step S16). In this case also, the determination for performing the power-outage processing is not made. In addition, in the case in which the state of the power-source voltage V has not returned to the first state in step S15, the processing from step S14 is repeated.

In the case in which a momentary power outage, where the power-source voltage V temporarily drops, has occurred, the power-source voltage V that has become the second state sometimes achieves a positive peak voltage in the second state without returning to the first state. In this case, the first timer 6 continues to measure the time without being reset.

Then, in step S14, in the case in which the time T1 during which the second state is achieved is longer than the prescribed time ΔT1, the determination for performing the power-outage processing is made (step S11). Specifically, the power-outage determining portion 8 makes a determination for performing the power-outage processing, when the time T2 measured by the second timer 7 exceeds one cycle ΔT2 of the power-source voltage V, while the state of the power-source voltage V is in the third state.

In this case, the power-source voltage V has dropped so low that the positive peak value of the power-source voltage V that occurs in one cycle does not exceed the second threshold voltage Th2; therefore, it is necessary to immediately perform power-outage processing.

In step S16, whether to end the processing is determined after the first timer 6 is reset (step S17), and, in the case in which the processing has not ended, the steps from step S4 are repeated.

As has been described above, with the controller 1 of the robot 200 and the power-outage processing method according to this embodiment, in the case in which the power-source voltage V returns to the first state in one cycle, the power-source voltage V is normal, and thus, the power-outage processing is not performed. In addition, even in the case in which the power-source voltage V does not return to the first state in one cycle, the case in which the power-source voltage V returns to the first state in the prescribed time ΔT1 is a case of a temporary drop in the power-source voltage V, and thus, the power-outage processing is not performed.

In contrast, the case in which the power-source voltage V does not return to the first state from the second state for the prescribed time ΔT1 and the case in which the power-source voltage V does not return to the second state from the third state for one cycle ΔT2 can be determined not to be cases of temporary drops in the power-source voltage V, and thus, the power-outage processing is performed.

Specifically, as a result of not performing the power-outage processing even if a state in which peak value of the power-source voltage V does not exceed the first threshold voltage Th1 is achieved, if said state does not exceed the prescribed time ΔT1, an advantage is afforded in that it is possible to prevent the controller 1 from frequently being stopped.

In contrast, the power-outage processing is performed when a state in which the peak value of the power-source voltage V does not exceed the first threshold voltage Th1 continues beyond the prescribed time ΔT1 and when the power-source voltage V does not exceed the second threshold voltage Th2 for one cycle. By doing so, it is possible to ensure sufficient power for performing the power-outage processing.

Internal current values of an AC/DC converter and a servo amplifier (not shown) included in the controller 1 increase when the power-source voltage V drops in order to ensure a certain amount of power in accordance with the drop. In this case, the amounts of heat generated in internal components and wiring increase.

With the controller 1 of the robot 200 and the power-outage processing method according to this embodiment, the continuation of the state in which the peak value of the power-source voltage V does not exceed the first threshold voltage Th1 is limited within the prescribed time ΔT1. Accordingly, the operation of the controller 1 is prevented from being continued for a long period of time in a state in which the power-source voltage V remains low, and thus, there is an advantage in that it is possible to prevent a deterioration in the lifetime of the individual components due to heat generation.

Note that, in this embodiment, the power-outage processing is performed in the case in which the peak value of the power-source voltage V does not exceed the second threshold voltage Th2 for one cycle; alternatively, however, the power-outage processing may be performed in the case in which absolute value of the peak value of the power-source voltage V does not exceed the second threshold voltage Th2 for a half cycle. By doing so, it is possible to quickly perform the power-outage processing even in the case in which the absolute value of a negative peak value does not exceed the second threshold voltage Th2.

The invention claimed is:
1. A controller for a robot, comprising:
a processor;
a power source connected to the robot, wherein the power source generates a power-source voltage with a periodic waveform;
a voltmeter connected to the power source and to the processor, wherein the voltmeter detects the power-source voltage and generates a voltage signal that is received by the processor;
a first timer connected to the power source and to the processor, wherein the first timer is started at a first point in time when the voltage signal is equal to or less than a first threshold voltage and generates a first time signal that is received by the processor; and
a capacitor connected to the power source and to the processor, the capacitor storing electric charge required to perform power-outage processing, wherein the processor is configured to:
receive the voltage signal and the first time signal,
determine whether the voltage signal exceeds the first threshold voltage before the first time signal achieves a prescribed time period that is longer than one cycle of the power source voltage, and
if the voltage signal does not exceed the first threshold voltage before the first time signal achieves the prescribed time period, perform power-outage processing by utilizing the electric charge stored in the capacitor to shut down the robot to prevent the robot from frequently being stopped.

2. The controller for a robot, according to claim 1, further comprising:
a second timer connected to the power source and to the processor, wherein the second timer is started at a second point in time when the voltage signal is equal to or less than a second threshold voltage that is lower than the first threshold voltage and generates a second time signal that is received by the processor,
wherein the processor is further configured to:
receive the second time signal,
determine whether the voltage signal exceeds the second threshold voltage before the second time signal exceeds the one cycle of the power-source voltage, and
if the voltage signal does not exceed the second threshold voltage before the second time signal exceeds the one cycle of the power-source voltage, perform the power-outage processing to shut down the robot.

3. The controller for a robot, according to claim 1, wherein the prescribed time is a value greater than a predetermined average momentary power outage time.

4. The controller for a robot, according to claim 1, wherein the prescribed time is a value greater than an acceleration period of the robot.

5. A power-outage processing method for a robot, comprising:
detecting, via a voltmeter connected to the robot, a power-source voltage with a periodic waveform generated by a power source;
generating, via the voltmeter, a voltage signal;
generating a first time signal, via a first timer connected to the power source and the processor, the first timer being started at a first point in time when the voltage signal is equal to or less than a first threshold voltage;
storing, via a capacitor, electric charge required to perform power-outage processing;
receiving, via a processor, the voltage signal and the first time signal;
determining, via the processor, whether the voltage signal exceeds the first threshold voltage before the first time signal achieves a prescribed time period that is longer than one cycle of the power source voltage; and
if the voltage signal does not exceed the first threshold voltage before the first time signal achieves the prescribed time period, performing, via the processor, power-outage processing by utilizing the electric charge stored in the capacitor to shut down the robot to prevent the robot from frequently being stopped.

6. The power-outage processing method for a robot, according to claim 5, further comprising:
generating a second time signal, via a second timer connected to the power source and the processor, the second timer being started a second point in time when the voltage signal is equal to or less than a second threshold voltage that is lower than the first threshold voltage;
receiving, via the processor, the second time signal;
determining, via the processor, whether the voltage signal exceeds the second threshold voltage before the second time signal exceeds the one cycle of the power-source voltage; and
if the voltage signal does not exceed the second threshold voltage before the second time signal exceeds the one cycle of the power-source voltage, performing, via the processor, the power-outage processing to shut down the robot.

7. The power-outage processing method for a robot, according to claim 5, wherein the prescribed time is a value greater than a predetermined average momentary power outage time.

8. The power-outage processing method for a robot, according to claim 5, wherein the prescribed time is a value greater than an acceleration period of the robot.

* * * * *